United States Patent
Bourdelle et al.

(10) Patent No.: US 7,407,548 B2
(45) Date of Patent: Aug. 5, 2008

(54) METHOD OF MANUFACTURING A WAFER

(75) Inventors: Konstantin Bourdelle, Crolles (FR);
Ian Cayrefourcq, St. Nazaire les Eymes (FR); Mark Kennard, Crolles (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 351 days.

(21) Appl. No.: 10/916,254

(22) Filed: Aug. 11, 2004

(65) Prior Publication Data
US 2005/0188915 A1    Sep. 1, 2005

(30) Foreign Application Priority Data
Mar. 1, 2004    (EP)    .................... 04290547

(51) Int. Cl.
*C30B 25/04*    (2006.01)

(52) U.S. Cl. .............. 117/94; 117/95; 117/96

(58) Field of Classification Search ............ 117/94, 117/95, 96
See application file for complete search history.

(56) References Cited

U.S. PATENT DOCUMENTS

| 4,766,092 A | 8/1988 | Kuroda et al. ............... 437/126 |
| 6,464,780 B1 | 10/2002 | Mantl et al. ............... 117/90 |
| 2003/0162340 A1* | 8/2003 | Tezen ........................ 438/184 |
| 2004/0045580 A1* | 3/2004 | Kurita et al. ............... 134/3 |
| 2004/0115905 A1 | 6/2004 | Barge et al. ............... 438/473 |

FOREIGN PATENT DOCUMENTS

| EP | 0 558 925 A1 | 9/1993 |
| EP | 1 014 430 A1 | 6/2000 |
| EP | 1 361 298 A1 | 11/2003 |
| JP | 57-172721 | * 10/1982 |
| WO | WO 01/15218 | 3/2001 |

OTHER PUBLICATIONS

XP000005771, "Molecular Beam Epitaxial Growth Of Gaas On Silicon With Buried Implanted Oxides" Electronics Letters, IEE Stevenage, Herts, GR. Britain, vol. 24, No. 1, pp. 67-68 (1988).

* cited by examiner

*Primary Examiner*—Robert M Kunemund
(74) *Attorney, Agent, or Firm*—Winston & Strawn LLP

(57) ABSTRACT

The present invention relates to a method of manufacturing a wafer comprising a single crystalline bulk substrate of a first material and at least one epitaxial layer of a second material which has a lattice different from the lattice of the first material. The present invention provides a method for manufacturing a wafer in which a layer which is lattice-mismatched with the substrate can be grown on the substrate with a high effectiveness and high quality at a low cost. A roughening step is included for roughening the surface of the bulk substrate and a growing step is included for growing the second material on the rough surface with a reduced number of threading dislocations and an enhanced strain relaxation compared to a second material that is epitaxially grown on a polished surface.

20 Claims, 4 Drawing Sheets

METHOD OF MANUFACTURING A WAFER

TECHNICAL FIELD

The present invention relates to a method of manufacturing a wafer comprising a single crystalline bulk substrate of a first material and at least one epitaxial layer of a second material which has a lattice different from the lattice of the first material.

It is commonly known that it is very difficult to grow a high quality epitaxial layer which is lattice-mismatched with the substrate on which it is grown. Due to the different lattice parameters, heteroepitaxial growth of a layer such as a SiGe layer on a substrate such as an Si wafer results in formation of misfit and associated threading dislocations. Lattice-mismatched layers such as the SiGe layer are therefore grown initially on an Si-substrate as graded buffer layers with a gradually increasing Ge content up to a relatively high thickness. Beyond a critical thickness, the lattice-mismatched layer relaxes, allowing further growth of a high-quality relaxed layer of the lattice-mismatched material on top of the buffer layer. In the case of an SiGe layer on a silicon substrate, the graded buffer SiGe layer may be as thick as 2 to 4 micrometers. The step for growing such thick layers is very time consuming and therefore contributes significantly to the final costs of the resulting heteroepitaxial wafers.

In an alternative method, the thickness of the SiGe buffer layer is reduced by applying a low temperature, high point defect silicon epitaxy before SiGe growth. Although with this technology the necessary thickness of the SiGe buffer layer can be reduced, applying a silicon epitaxy before the SiGe growth incurs additional costs, so that the resulting wafer preparation costs cannot be effectively reduced. Thus, improvements in these processes are desired.

SUMMARY OF THE INVENTION

The invention relates to a method of manufacturing a wafer comprising a single crystalline bulk substrate of a first material having a working surface which includes thereon at least one epitaxial layer of a second material which has a lattice different from the lattice of the first material. This method comprises roughening the working surface of the bulk substrate to provide a roughened surface and then growing an epitaxial layer of the second material on the roughened surface of the bulk substrate. The roughening preferably creates point defects close to the working surface. Thus, the second material grows on the roughened surface with a reduced number of threading dislocations and an enhanced strain relaxation compared to that of a second material that is epitaxially grown on a polished surface.

A preferred roughening step comprises ion implantation in the working surface of the bulk substrate. Advantageously, the ion implantation is conducted with an implantation dose that is kept below amorphization of the surface of the bulk substrate. A typical implantation dose is between about $5 \times 10^{12}$ cm$^{-2}$ and about $5 \times 10^{14}$ cm$^{-2}$.

Additional steps can be conducted to optimize the bonding or properties of the epitaxially grown second material. These can include etching of the surface of the bulk substrate as part of the roughening, polishing the roughened working surface prior to growing the second material thereon, oxidizing the roughened surface of the bulk material followed by removing surface oxides prior to growing the second material on the working surface of the bulk material, and/or annealing step at least the working surface of the bulk material prior to growing second material thereon.

BRIEF DESCRIPTION OF THE DRAWINGS

Specific embodiments of the present invention will become more apparent from the following detailed description with reference to the accompanying drawings, wherein.

DETAILED DESCRIPTION OF PREFERRED EMBODIMENTS

Figure 1:
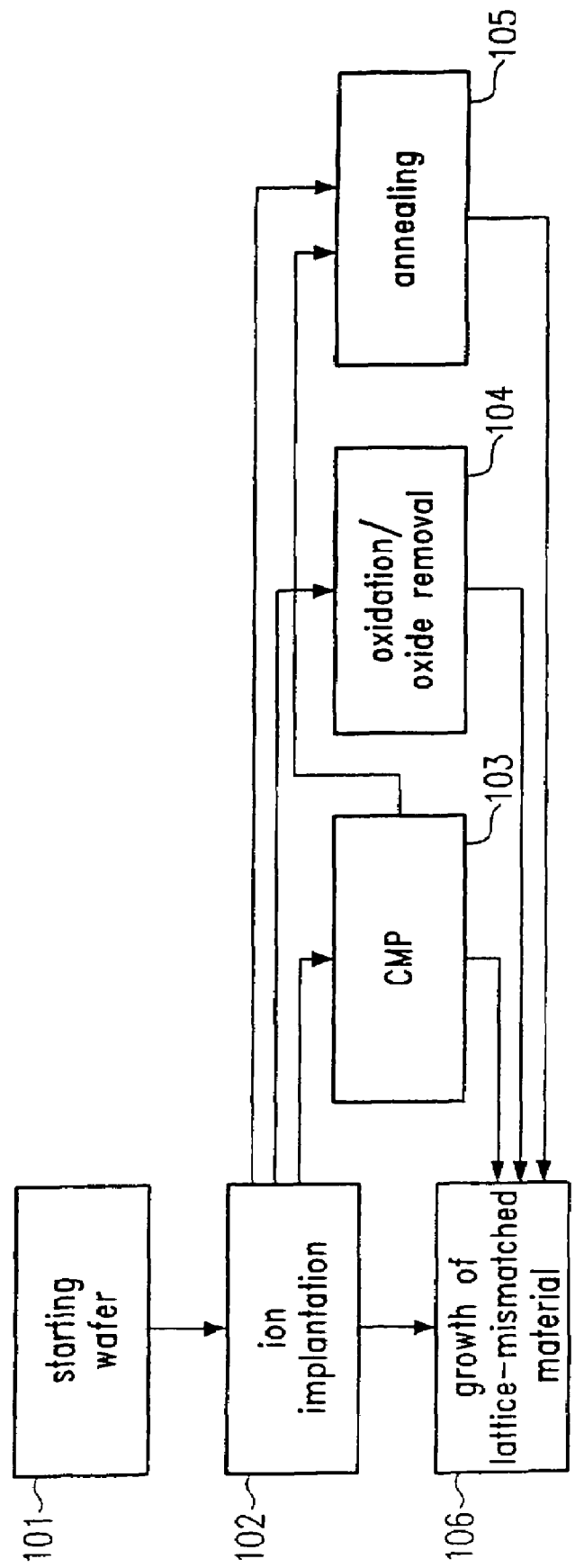
FIG. 1. schematically shows a method of manufacturing a wafer according to a first embodiment of the present invention.

The present invention provides a method for manufacturing a wafer with which a layer which is lattice-mismatched with a substrate can be grown with a high effectiveness and high quality at a low cost on the substrate. This is achieved by a method that includes a roughening step for roughening of the surface of the bulk substrate and a growing step for growing of the second material on the rough surface of the bulk substrate.

Surprisingly, the roughened surface provides a better basis for the growth of the second material than a high quality, mirror-polished surface. The second material grows on the roughened substrate with a reduced number of threading dislocations and an enhanced strain relaxation. Therefore, the second lattice-mismatched material can already reach a high quality at a low thickness level. Roughening of the surface of the bulk substrate can be done very easily in a low cost step so that the wafer manufacturing costs can be effectively reduced.

In a favorable embodiment of the invention, the roughening step comprises creating point defects close to the surface. These point defects can be helpful in creating a high quality starting layer of the second material so that the second material can be grown with a higher effectiveness compared to growth of the same material on a polished surface.

In an advantageous variant of the invention, the roughening step comprises ion implantation in the surface of the bulk substrate. This step allows an effective and defined introduction of point defects at or near the surface for good growth of a second material.

In a favorable example of the invention, the implantation dose is kept below amorphization of the bulk substrate. This way, a high number of point defects can be introduced at or near the surface of the bulk substrate without complete destruction of the crystallinity of the bulk substrate. As noted, the implantation dose is maintained at between about $5 \times 10^{12}$ cm$^{-2}$ and about $5 \times 10^{14}$ cm$^{-2}$ to result in a particularly favorable number of point defects at the surface of the bulk substrate.

In a further variant of the invention, the roughening step comprises a step of dry or wet etching of the surface. Dry or wet etching very effectively increases micro-roughness of the surface. Preferably, the wet etching step comprises etching with an etchant selected from the group consisting of KOH, TMAH or HF. Such an etchant is especially favorable for allowing controlled etching rates with a controlled increase of the surface roughness of the substrate.

Dry etching can be performed with an inert gas such as an Argon plasma resulting in easily adjustable surface roughness values.

In another embodiment of the invention, the method further comprises a chemical-mechanical polishing step between the surface roughening step and the step of growing the second material. The chemical-mechanical polishing (CMP) step removes from the surface defects and/or surface inhomogeneities which are too large or too strong for further high quality growth of the second material. Chemical-mechanical polishing is utilized in such a way that a certain degree of roughening of the surface is maintained so that an easy but high quality growth of the second material can be achieved.

In another embodiment of the invention, the method further comprises a surface oxidation and oxide removal step between the surface roughening step and the step of growing the second material. This procedure allows the removal from the surface of excessively large or strong defects or inhomogeneities which could be preventive of a high quality growth of the second material. The surface oxidation and oxide removal step does not fully remove all defects or microroughness of the surface so that the second material can be grown with a low thickness but a high quality.

In a yet further variant of the invention, the method further comprises an annealing step between surface roughening step and step of growing the second material. The annealing step can help to balance or smooth out inhomogeneities, defects and/or micro-roughness of the surface after the roughening step, leading to a much more effective high quality growth of the second material on the substrate.

Figure 2:
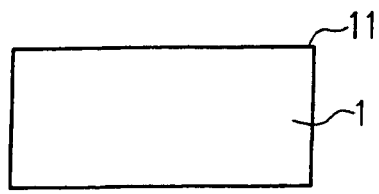
FIG. 2 schematically shows a starting wafer used in the present invention.

FIG. 1 schematically shows a method of manufacturing a wafer according to a first embodiment of the present invention. With reference to step 101, a starting wafer 1, as shown in FIG. 2, is provided. The starting wafer can be of any material, for example Si, Ge, SiC or GaAs, and is a silicon wafer in the embodiment shown.

Figure 3:
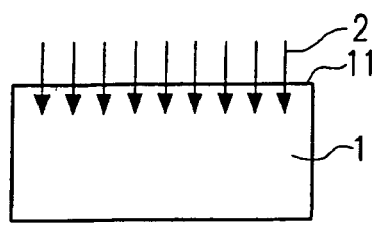
FIG. 3 schematically shows an implantation step according to the first embodiment of the present invention shown in FIG. 1.

In step 102, which follows step 101, an ion implantation is performed on the starting wafer 1. FIG. 3 schematically shows the wafer 1 during the ion implantation step 102. Ions or ion clusters 2, such as hydrogen, boron, He, $B_{10}H_{14}$, Si, Ge and/or oxygen implants are implanted in a region at or near a surface 11 of the wafer 1.

The implantation is performed with an energy of about 0.2 to about 5 keV. The implantation dose used is between about $5 \times 10^{12}$ cm$^{-2}$ to about $5 \times 10^{14}$ cm$^{-2}$. The implantation dose is kept below amorphization of the wafer material. The ion implantation of step 102 changes the doping level of the wafer 1 and introduces point defects 4 in an area 3 close to the surface 11 of the wafer 1, as shown in FIG. 4.

Figure 4:
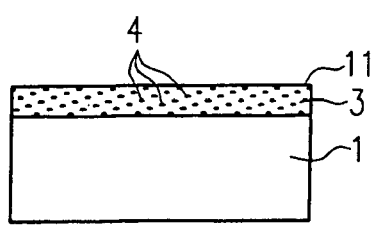
FIG. 4 schematically shows the wafer of FIG. 2 after the implantation step of FIG. 3.
Figure 5:
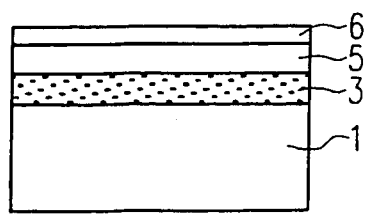
FIG. 5 schematically shows the wafer of FIG. 4 after growth of a graded buffer layer and a relaxed layer of a material which is lattice-mismatched with the wafer of FIG. 2.

As shown in FIG. 5, after the ion implantation step 102, a graded buffer layer 5 such as a graded buffer GeSi layer, and a relaxed layer 6 thereon, such as a relaxed GeSi layer, are grown on the implanted wafer of FIG. 4. The graded buffer layer has a gradually increasing Ge content, whereas in the relaxed layer there is a constant relationship between Ge and Si. Instead of GeSi, any other material which is lattice-mismatched with the substrate can be used for the buffer layer and the relaxed layer. In particular, GaAs, Ge, GaN or SiC can be grown on Si.

Surprisingly, the graded buffer layer 5 can be grown starting from the defect-containing surface 11 of the implanted wafer with a better quality than on a mirror-polished, defect-free surface of a conventional wafer. Therefore, only a relatively thin thickness of the graded buffer layer 5 is necessary for achieving a good basis for the growth of the relaxed layer 6 with a very high quality.

Figure 6:
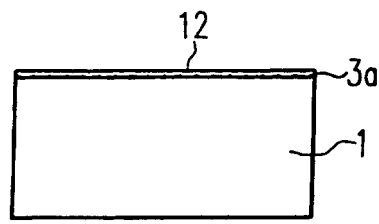
FIG. 6 schematically shows the wafer of FIG. 4 after a chemical-mechanical polishing of its surface.

FIG. 6 schematically shows the structure of FIG. 4 after a chemical-mechanical polishing step. In this step, which corresponds to step 103 in FIG. 1, the thickness of the top layer 3 of the structure 4 is reduced. The resulting thinner layer 3a on top of the wafer 1 comprises point defects introduced in the aforementioned ion implantation step 102. In comparison with the surface 11 of the implanted structure of FIG. 4, the structure of FIG. 6 has a surface 12 with reduced roughness.

Figure 7:
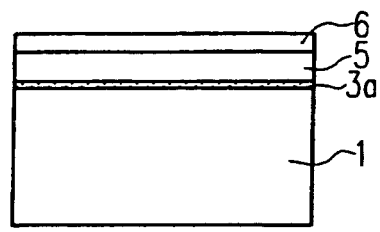
FIG. 7 schematically shows the wafer of FIG. 6 after growth of a graded buffer layer and a relaxed layer of a lattice-mismatched material.

FIG. 7 schematically shows the structure of FIG. 6 after growth of the lattice-mismatched material of step 106 in FIG. 1. As mentioned in the examples described above, the buffer layer 5 grows with an enhanced strain relaxation on the roughened surface 12 of the top layer 3a. This reduces the minimum thickness of the buffer layer 5 which is necessary for good and effective growth of a high quality relaxed layer 6.

Figure 8:
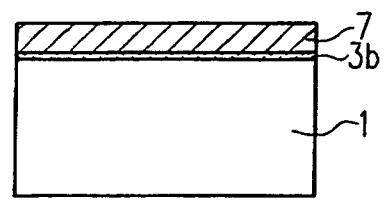
FIG. 8 schematically shows the wafer of FIG. 4 after an oxidation step.

FIG. 8 schematically shows the structure of FIG. 4 after an oxidation step, shown as step 104 in FIG. 1. Here, an upper part of the implanted layer 3 is oxidized in an oxygen- or water vapor-containing atmosphere, resulting in an oxide layer 7 on top of a residual, non-oxidized part 3b of the former layer 3.

Figure 9:
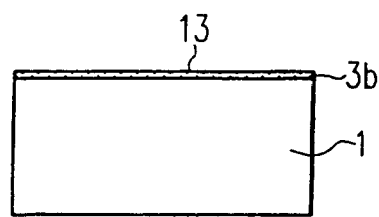
FIG. 9 schematically shows the wafer of FIG. 8 after a removal of the oxide layer.

FIG. 9 schematically shows the structure of FIG. 8 after removal of the oxide layer. In a preferable example of the invention, the oxide layer 7 is removed with an etching step using HF. The oxidation and oxide removal step 104 results in a structure with a layer 3b on top of the wafer 1. The layer 3b has a reduced thickness in comparison with the originally implanted layer 3 of FIG. 4, and a reduced surface microroughness of its surface 13.

Figure 10:
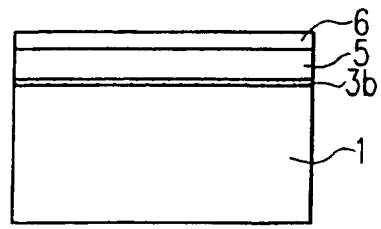
FIG. 10 schematically shows the wafer of FIG. 9 after growth of a graded buffer layer and a relaxed layer of a lattice-mismatched material.

FIG. 10 schematically shows the structure of FIG. 9 after growth of lattice-mismatched material in accordance with step 106 of FIG. 1, in which a graded buffer layer 5 and a relaxed layer 6 thereon are grown very effectively and with a high strain relaxation on top of the roughened surface of the layer 3b.

Figure 11:
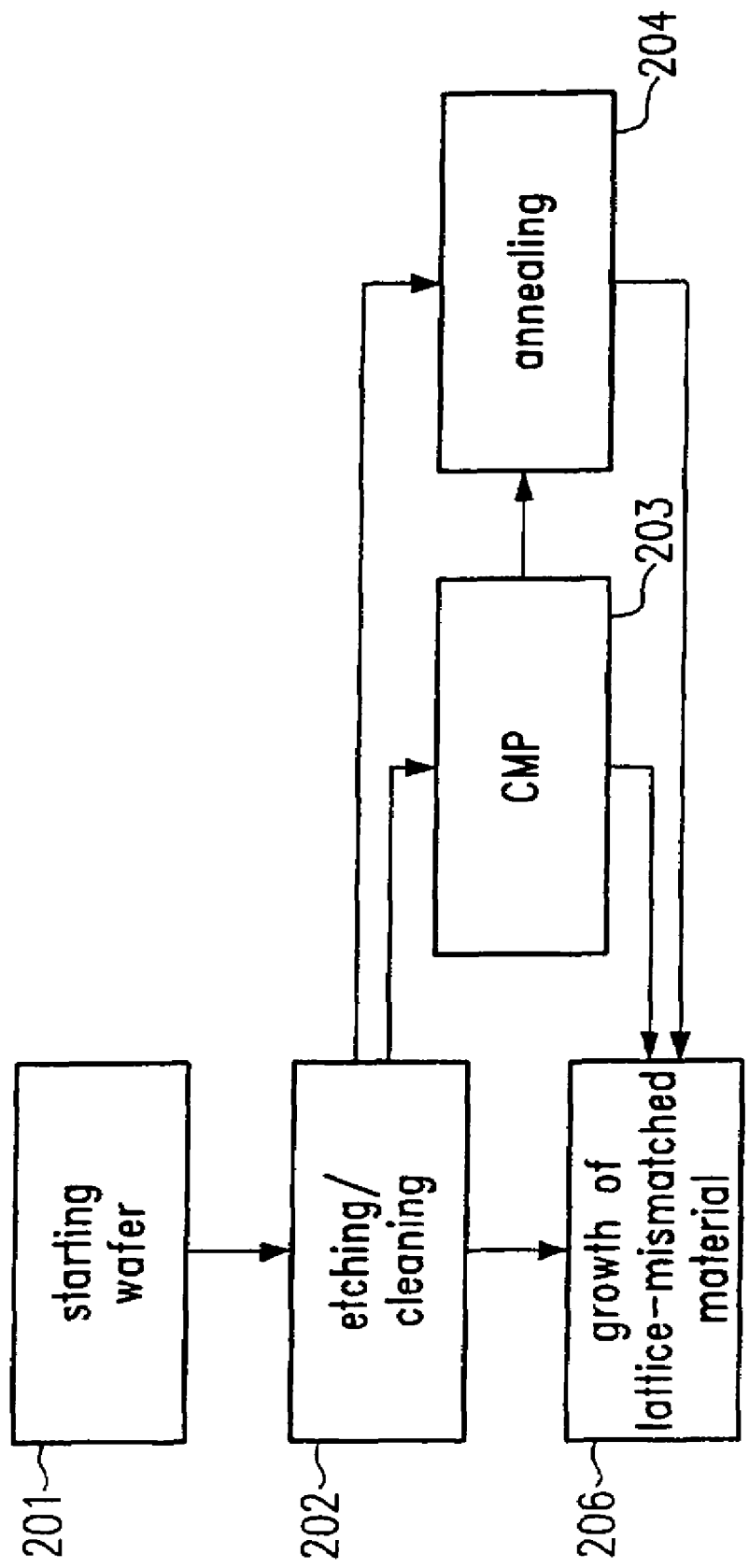
FIG. 11 schematically shows a method of manufacturing a wafer according to a second embodiment of the present invention.

FIG. 11 schematically shows a method of manufacturing a wafer according to a second embodiment of the present invention. The method starts with a starting wafer 1 in step 201 wherein the starting wafer is comparable with the starting wafer used in step 101 of the first embodiment of the present invention shown in FIG. 11.

Then an etching and cleaning step 202 is applied on the starting wafer 1. The etching step uses wet etching with at least one of the following etchants: KOH, TMAH and/or HF.

KOH has a strong etching rate of about 1 µm/min and results in an increase of surface micro-roughness of the surface 11 of the wafer 1. Wet etching with KOH should preferably be used as a back end process.

TMAH also has a strong etching rate of about 0.6 µm/min and also results in an increase of surface micro-roughness of the surface 11 of the wafer 1. Etching with TMAH should preferably be used as a front end process.

Wet etching with an HF etchant results in a low etch rate but a controlled increase of the surface micro-roughness of the surface 11 of the wafer 1. HF etching should preferably be used as a front end process. In an advantageous example of the invention, an HF etchant with 1% HF is applied on the wafer 1 for 15 hours. The etching step results in a surface micro-roughness of the wafer 1 of about 2.5 Å RMS on a 1×1 µm$^2$ area. This value is higher than the RMS value with HF etching, which is about 1.5 Å RMS.

The cleaning step which is applied in step 202 is a conventional cleaning step such as rinsing in de-ionized water, but can also be any other conventional cleaning step which provides a removal of residuals of the etchant on the etched wafer.

In a method similar to that of the first embodiment of the present invention, in step 205 (which is comparable with step 106 of FIG. 1) a growth of a lattice-mismatched material can be made directly after the etching and cleaning step 202.

In other examples of the second embodiment of the present invention, intermediate steps such as chemical-mechanical polishing in step 203 and/or an annealing step in 204 can be applied, between the etching and cleaning step 202 and the growing step 205, on the etched structure resulting from step 202.

Figure 12:
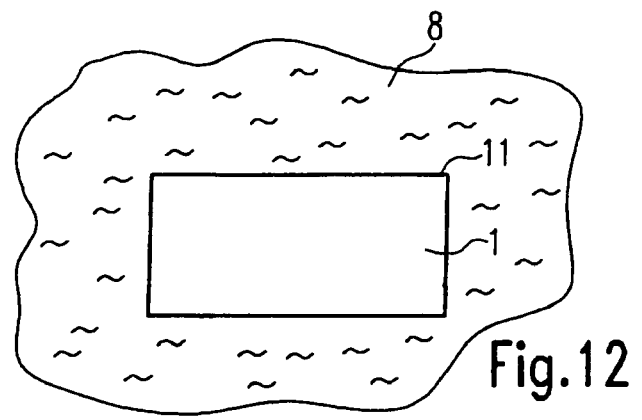
FIG. 12 schematically shows the wafer of FIG. 2 during an etching step used in the second embodiment of the present invention, shown in FIG. 11.

With reference to FIG. 12, the etching step 202 is shown, in which the wafer 1 is immersed in a bath with an etchant 8 comprising KOH, TMAH or HF.

Figure 13:
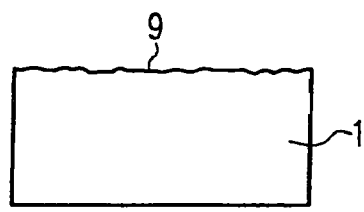
FIG. 13 schematically shows the wafer of FIG. 12 after the etching step.

FIG. 13 schematically shows the structure which has been etched in the step 202 shown in FIG. 12 after the etching step. After the etching step, the wafer 1 has a surface 9 with an increased surface micro-roughness.

Figure 14:
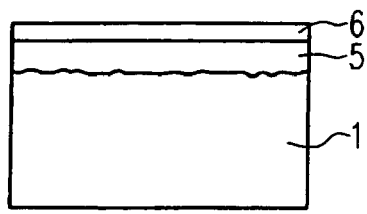
FIG. 14 schematically shows the wafer of FIG. 13 after growth of a graded buffer layer and a relaxed layer of a lattice-mismatched material.

FIG. 14 schematically shows the structure of FIG. 13 after growth of a lattice-mismatched material comprising a graded buffer layer 5 and a relaxed layer 6. Surprisingly, the buffer layer 5 grows on the roughened surface 9 of the wafer 1 with an increased strain relaxation. The epitaxial growth of the graded buffer layer 5 on the roughened surface 9 of the wafer 1 is much better than on a mirror-polished surface of a conventional wafer.

This means that the thickness of the graded buffer layer which is necessary for growing a high quality relaxed layer on top of this layer is much lower than is known from state-of-the-art processes where a relatively high thickness of the buffer layer 5 has been found necessary to provide a good basis for the relaxed layer. This way, the layers 5 and 6 which are of materials and lattice constants different from that of the wafer 1 can be very effectively grown on the wafer 1. For instance, a high quality SiGe graded buffer layer 5 and a high quality SiGe relaxed layer 6 with a constant SiGe relationship can be produced on the silicon wafer 1.

Figure 15:
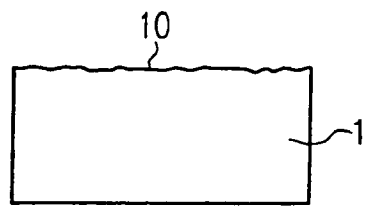
FIG. 15 schematically shows the wafer of FIG. 13 after a chemical-mechanical polishing step.

FIG. 15 schematically shows the wafer of FIG. 13 after the chemical-mechanical polishing step 203 and/or the annealing step 204. Chemical-mechanical polishing flattens the surface 9 of the structure shown in FIG. 13 into a surface 10 with a reduced surface micro-roughness. Instead of or after the chemical-mechanical polishing step 203, the annealing step 204 can be applied on the structure of FIG. 13, also resulting in a surface 10 with reduced surface micro-roughness but having a micro-roughness which is higher than that of conventional mirror-polished wafers.

Figure 16:
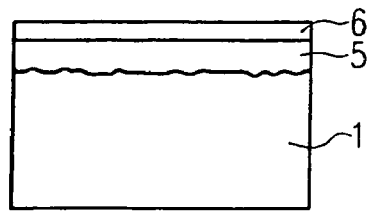
FIG. 16 schematically shows the wafer of FIG. 15 after growth of a graded buffer layer and a relaxed layer of a lattice-mismatched material.

FIG. 16 schematically shows the structure of FIG. 15 after growth of a lattice-mismatched graded buffer layer 5 and a relaxed layer 6 on the wafer 1. The increased micro-roughness of the surface 10 of the wafer 1 is helpful in providing a very good growth of the buffer layer 5 on the wafer 1. This way, the buffer layer 5 can be grown on the different material of the wafer 1 with an increased strain relaxation resulting in a low thickness upon which the high quality relaxed layer 6 can be grown.

What is claimed is:

1. A method of manufacturing a wafer comprising a single crystalline bulk substrate of a first material having a working surface which includes thereon at least one epitaxial layer of a second material which has a lattice different from the lattice of the first material, which method comprises
    roughening the working surface of the bulk substrate sufficiently to provide a micro-roughened surface that is rougher than a polished surface and then
    growing an epitaxial layer of the second material on the micro-roughened working surface with a reduced number of threading dislocations and an enhanced strain relaxation compared to that of a second material that is epitaxially grown on a polished surface.

2. The method of claim 1, wherein the roughening comprises creating point defects close to the working surface so that the second material can be grown with a higher effectiveness compared to growth on a polished surface.

3. The method of claim 1, wherein the roughening step comprises ion implantation in the working surface of the bulk substrate.

4. The method of claim 3, wherein the ion implantation is conducted with an implantation dose that is kept below amorphization of the surface of the bulk substrate.

5. The method of claim 3, wherein the implantation dose is between about $5\times10^{12}$ cm$^{-2}$ and about $5\times10^{14}$ cm$^{-2}$.

6. The method of claim 1, which further includes etching of the surface of the bulk substrate as part of the roughening.

7. The method of claim 6 wherein the etching is dry etching with an inert gas.

8. The method of claim 6, wherein the etching includes wet etching with an etchant selected from the group consisting of KOH, TMAH and HF.

9. The method of claim 1, which further comprises polishing the roughened working surface prior to growing the second material thereon.

10. The method of claim 9, wherein the polishing comprises a chemical-mechanical polishing step.

11. The method of claim 1 which further comprises
    oxidizing the roughened surface of the bulk material followed by
    removing surface oxides prior to growing the second material on the working surface of the bulk material in order to remove large or strong defects or inhomogeneities which could interfere with the growth of the second material so that high quality thin layers of the second material can be provided on the working surface.

12. The method of claim 1 which further comprises annealing at least the working surface of the bulk material prior to growing second material thereon in order to balance or smooth out inhomogeneities, defects or micro-roughness of the working surface.

13. In a method of manufacturing a wafer comprising a single crystalline bulk substrate of a first material having a working surface which includes thereon at least one epitaxial layer of a second material which has a lattice different from the lattice of the first material, the improvement which comprises:

providing a rough working surface of the bulk material to provide a micro-roughened surface that is rougher than a polished surface for growth of an epitaxial layer of the second material thereon in order to obtain a reduced number of threading dislocations and an enhanced strain relaxation in the epitaxially grown material compared to that of a second material that is epitaxially grown on a polished surface.

14. The method of claim 13, wherein point defects are provided close to the working surface so that the second material can be grown with a higher effectiveness compared to growth on a polished surface.

15. The method of claim 13, wherein the roughening step comprises ion implantation in, etching of or oxidizing of the working surface of the bulk substrate.

16. The method of claim 13, which further comprises annealing or polishing of the roughened surface prior to epitaxial growth of the second material thereon.

17. The method of claim 3, wherein the implantation energy is between about 0.2 keV and about 5 keV.

18. A method of manufacturing a wafer comprising a single crystalline bulk substrate of a first material having a working surface which includes thereon at least one epitaxial layer of a second material which has a lattice different from the lattice of the first material, which method comprises:

roughening the working surface of the bulk substrate to provide a micro-roughened surface that is rougher than a polished surface, wherein the roughening comprises the combination of (a) ion implantation in the working surface of the bulk substrate at an implantation energy between about 0.2 keV and about 5 keV and at an implantation dose that is kept below amorphization of the surface of the bulk substrate and is between about $5 \times 10^{12}$ cm$^{-2}$ and about $5 \times 10^{14}$ cm$^{-2}$, and (b) etching or oxidizing of the working surface; and growing an epitaxial layer of the second material on the roughened surface with a reduced number of threading dislocations and an enhanced strain relaxation compared to that of a second material that is epitaxially grown on a polished surface.

19. The method of claim 18, wherein the working surface is roughened by ion implantation and etching, wherein the etching is wet or dry etching.

20. The method of claim 18, wherein the working surface is roughened by ion implantation and oxidizing, followed by removing surface oxides prior to growing the second material on the working surface of the bulk material in order to remove large or strong defects or inhomogeneities which could interfere with the growth of the second material so that high quality thin layers of the second material can be provided on the working surface.

* * * * *